United States Patent
Touya et al.

(10) Patent No.: US 8,816,276 B2
(45) Date of Patent: Aug. 26, 2014

(54) ELECTRON BEAM WRITING APPARATUS AND ELECTRON BEAM WRITING METHOD

(71) Applicant: NuFlare Technology, Inc., Numazu (JP)

(72) Inventors: Takanao Touya, Kanagawa (JP); Takahito Nakayama, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/768,327

(22) Filed: Feb. 15, 2013

(65) Prior Publication Data

US 2013/0214172 A1    Aug. 22, 2013

(30) Foreign Application Priority Data

Feb. 16, 2012    (JP) .................. 2012-032189

(51) Int. Cl.
  G21K 5/04    (2006.01)
  H01J 37/30    (2006.01)

(52) U.S. Cl.
  USPC ........ 250/306; 250/307; 250/310; 250/396 R; 250/492.22; 250/492.3

(58) Field of Classification Search
  USPC ...... 250/306, 307, 310, 396 R, 492.22, 492.3
  See application file for complete search history.

(56) References Cited

U.S. PATENT DOCUMENTS

| | | | |
|---|---|---|---|
| 6,303,932 B1 * | 10/2001 | Hamamura et al. | 850/43 |
| 6,946,654 B2 * | 9/2005 | Gerlach et al. | 850/3 |
| 7,095,023 B2 | 8/2006 | Nagano et al. | |
| 7,109,501 B2 | 9/2006 | Nagano et al. | |
| 7,425,714 B2 * | 9/2008 | Sakakibara et al. | 250/492.22 |
| 7,485,879 B2 | 2/2009 | Sunaoshi et al. | |
| 7,554,107 B2 | 6/2009 | Yoshitake et al. | |
| 7,643,130 B2 | 1/2010 | Yoshitake et al. | |
| 7,679,068 B2 | 3/2010 | Kamikubo et al. | |
| 7,800,084 B2 | 9/2010 | Tamamushi | |
| 7,834,333 B2 | 11/2010 | Nishimura et al. | |
| 8,067,753 B2 | 11/2011 | Touya | |
| 8,183,544 B2 | 5/2012 | Tsuruta et al. | |
| 8,188,443 B2 | 5/2012 | Ohtoshi et al. | |

(Continued)

FOREIGN PATENT DOCUMENTS

| JP | 9-293670 | 11/1997 |
|---|---|---|
| JP | 2006-128564 | 5/2006 |

OTHER PUBLICATIONS

U.S. Appl. No. 13/706,908, filed Dec. 6, 2012, Yoshikawa, et al.
U.S. Appl. No. 13/763,976, filed Feb. 11, 2013, Touya, et al.

(Continued)

Primary Examiner — Nikita Wells
(74) Attorney, Agent, or Firm — Oblon, Spivak, McClelland, Maier & Neustadt, L.L.P.

(57) ABSTRACT

An electron beam writing apparatus comprising a XY stage that a sample is placed on, an electron optical column, an electron gun emitting an electron beam disposed in the optical column, an electrostatic lens provided with electrodes aligned in an axial direction of the electron beam disposed in the optical column, wherein a shield plate is disposed between the XY stage and the electron optical column to block reflected electrons or secondary electrons generated by irradiation to the sample with the electron beam. The electrostatic lens is disposed immediately above the shield plate to change a focal position of the electron beam. A voltage supply device applies a negative voltage constantly to the electrostatic lens.

13 Claims, 6 Drawing Sheets

(56) References Cited

U.S. PATENT DOCUMENTS

| | | |
|---|---|---|
| 8,207,514 B2 | 6/2012 | Hara et al. |
| 8,229,207 B2 | 7/2012 | Tamamushi |
| 8,277,603 B2 | 10/2012 | Tamamushi et al. |
| 8,306,310 B2 | 11/2012 | Tamamushi |
| 2011/0255770 A1 | 10/2011 | Touya et al. |
| 2012/0193553 A1* | 8/2012 | Touya .................... 250/492.22 |
| 2013/0010291 A1 | 1/2013 | Tamamushi |
| 2013/0056645 A1 | 3/2013 | Yoshikawa et al. |
| 2013/0056647 A1 | 3/2013 | Yoshikawa et al. |
| 2013/0082187 A1 | 4/2013 | Ogasawara |

OTHER PUBLICATIONS

U.S. Appl. No. 13/768,258, filed Feb. 15, 2013, Touya, et al.
Office Action issued Dec. 12, 2013 in Korean Application No. 10-2013-0015156 (With English Translation).
U.S. Appl. No. 14/108,844, filed Dec. 17, 2013, Touya, et al.
U.S. Appl. No. 14/108,936, filed Dec. 17, 2013, Touya, et al.

* cited by examiner

ELECTRON BEAM WRITING APPARATUS AND ELECTRON BEAM WRITING METHOD

CROSS-REFERENCE TO THE RELATED APPLICATION

The entire disclosure of the Japanese Patent Application No. 2012-032189, filed on Feb. 16, 2012 including specification, claims, drawings, and summary, on which the Convention priority of the present application is based, are incorporated herein in its entirety.

FIELD OF THE INVENTION

The present invention relates to an apparatus and method for writing patterns with an electron beam.

BACKGROUND

The tendency in recent years towards higher mounting densities and larger capacities of large-scale integrated (LSI: Large Scale Integration) circuits are further reducing the circuit line widths needed for semiconductor devices.

Fabrication of semiconductor devices involves the use of photomasks or reticles (hereinafter, referred to collectively as masks) each having circuit patterns formed thereon. The circuit patterns on a mask are photolithographically transferred on to a wafer using a reduction projection exposure apparatus, often called a stepper, whereby the circuit patterns are formed on the wafer. An electron beam writing apparatus capable of writing fine patterns is used to manufacture the masks used to transfer the fine circuit patterns onto the wafer. An electron beam writing apparatus has inherently superior resolution, and can ensure greater depth of focus, thus allowing control over size fluctuations even with a difference in level.

Japanese Laid-Open Patent Publication No. Hei 9-293670 (1997) discloses a variable shape electron beam writing apparatus used for electron beam lithography. The pattern writing data for such apparatus is prepared by using design data (CAD data) of a semiconductor integrated circuit, designed by a CAD system and processing it, such as correcting the data and dividing the pattern.

For example, the pattern is divided into segments each the size of the maximum shot size, which is defined by the size of the electron beam. After this division of the pattern, the apparatus sets the coordinate positions and size of each shot and the radiation time. Pattern writing data is then produced which is used to shape the shot in accordance with the shape and size of the pattern or pattern segment to be written. The pattern writing data is divided into pieces each corresponding to a strip-shaped frame (or main deflection region), and each frame is divided into sub-deflection regions. That is, the pattern writing data for the entire wafer has a hierarchical data structure in which data of each of a plurality of strip-shaped frames, which correspond to the main reflection regions, is divided into a plurality of data each representing one of the plurality of sub-reflection regions (smaller in size than the main deflection regions) in the frame.

The electron beam is scanned over each sub-deflection region by the sub-deflector at a higher speed than it is scanned over each main deflection region; the sub-deflection regions are generally the smallest writing fields. When writing on each sub-deflection region, the shaping deflector forms a shot of a size and shape corresponding to the pattern or pattern segment to be written. Specifically, the electron beam emitted from the electron gun is shaped into a rectangular shape by a first aperture and then projected to a second aperture by the shaping deflector, resulting in a change in the shape and size of the beam. The electron beam is then deflected by the sub-deflector and the main deflector, and irradiated onto the mask mounted on the stage.

Furthermore, when a mask is irradiated with an electron beam, electrons reflected on the mask (reflected electrons) or electrons generated after entering the mask (secondary electron) proceed upward within an electron optical column.

Figure 5:
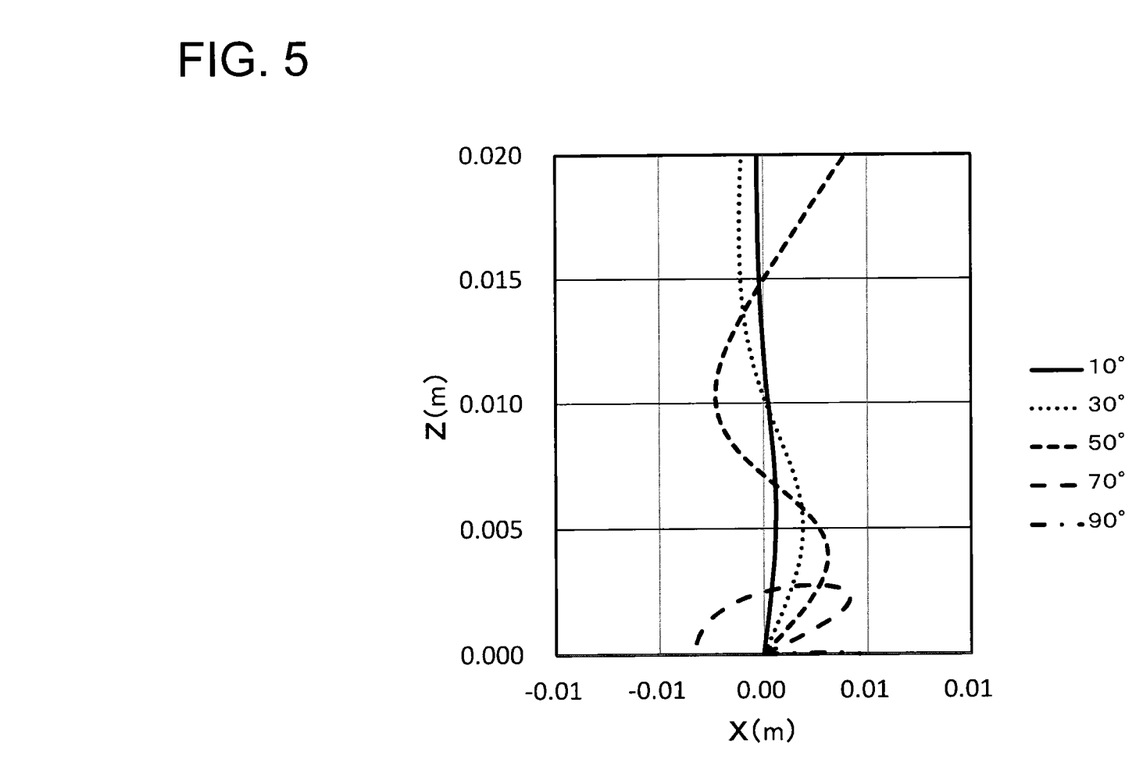
FIG. 5 is a simulation of a path of reflected electrons having an energy value of 50 keV.

FIG. 5 is a simulation of a path of reflected electrons having an energy value of 50 keV. Here, the simulation is performed only in a single direction in relation to each of exit angles of 10°, 30°, 50°, 70°, and 90°.

Figure 6:
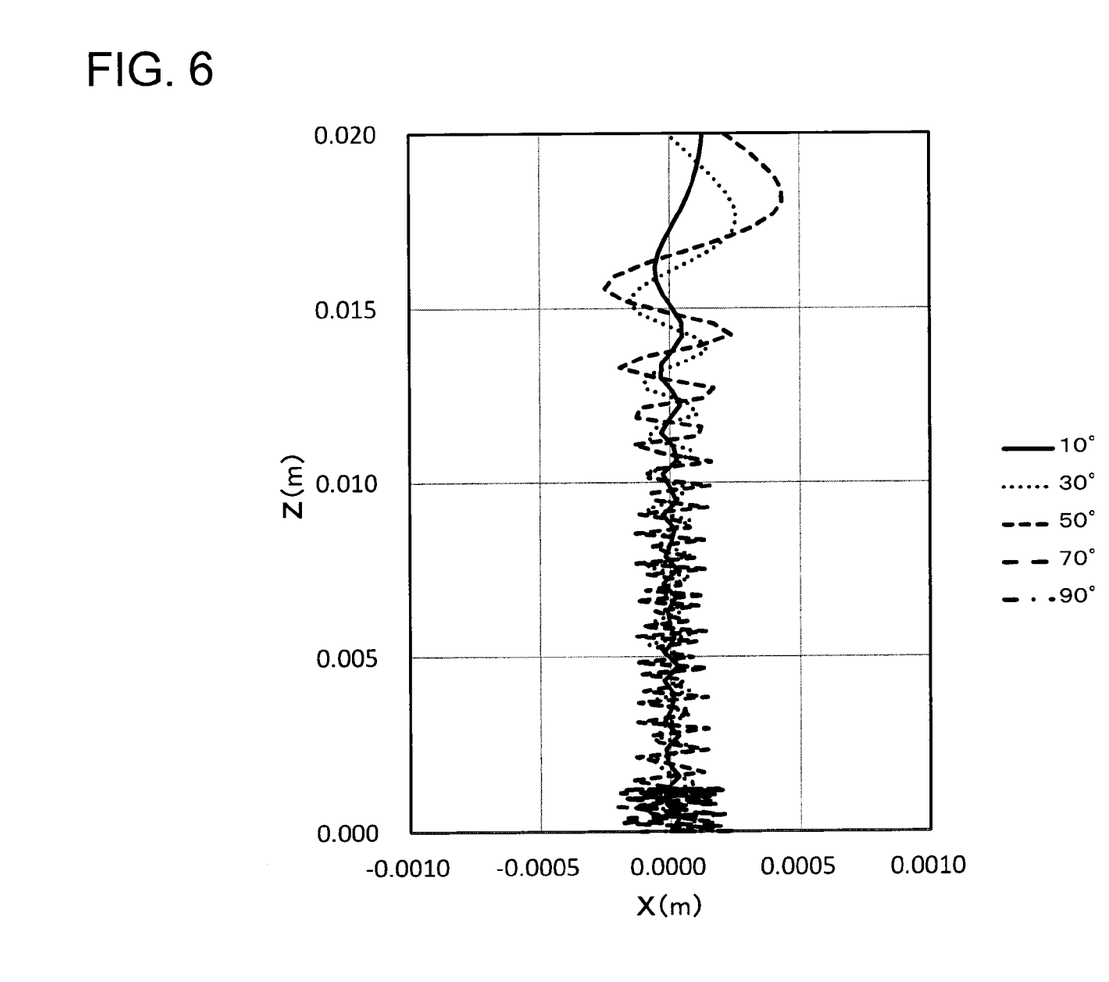
FIG. 6 is a simulation of a path of secondary electrons having an energy value of 100 eV.

FIG. 6 is a simulation of a path of secondary electrons having an energy value of 100 eV. The simulation is performed only in a single direction in relation to each of exit angles of 10°, 30°, 50°, 70°, and 90°.

It should be noted that in FIGS. 5 and 6, the horizontal axis represents an x-axis, namely, a direction perpendicular to an electron beam axis. In addition, the vertical axis represents a Z-axis, namely, a direction parallel to the electron beam axis. Furthermore, in these cases, an electromagnetic type lens, namely, a lens that generates a magnetic field by causing electric current to flow in a coil is used as an objective lens.

As can be seen from the simulation results shown in FIGS. 5 and 6, the reflected electrons or the secondary electrons perform a helical motion, coiling around the electron beam axis. Accordingly, the electron beam drifts under the influence of the reflected electrons or the secondary electrons, which results in irradiation to a position deviated from a target position.

The present invention has been made in view of the above problems. It is, therefore, an object of the present invention is to provide an electron beam writing apparatus and an electron beam writing method capable of reducing the electron beam drift due to the reflected electrons or the secondary electrons.

Other challenges and advantages of the present invention are apparent from the following description.

SUMMARY OF THE INVENTION

According to one aspect of the present invention, an electron beam writing apparatus comprising a control unit and a writing unit having an electron optical column and a writing chamber, comprising; a stage on which a sample is placed in the writing unit, an electron gun unit, which is disposed in the electron optical column, configured to emit an electron beam, a shield plate, which is disposed between the stage and the electron optical column, configured to block reflected electrons or secondary electrons generated by irradiation to the sample with the electron beam from entering the writing chamber, and an electrostatic lens positioned in an axial direction of the electron beam in the electron optical column, wherein the electrostatic lens is disposed immediately above the shield plate and is being supplied with negative voltage, from a voltage supply device, constantly during writing patterns on the sample.

According to another aspect of the present invention, an electron beam writing apparatus wherein a negative voltage in a range between 0 V and −250 V is applied from the voltage supply device to the electrostatic lens.

According to another aspect of the present invention, an electron beam writing apparatus wherein a negative voltage between −100 V and −200 V on average is applied from the voltage supply device to the electrostatic lens.

According to another aspect of the present invention, an electron beam writing apparatus according further comprising, a first aperture for shaping the electron beam that has been emitted from the electron gun, a second aperture further shaping the electron beam that has passed through the first aperture, an illumination lens illuminating the first aperture with the electron beam, a projection lens projecting to the second aperture the electron beam that has passed through the first aperture, and an objective lens focusing the electron beam that has passed through the second aperture, wherein the illumination lens, the projection lens, and the objective lens are all electromagnetic type lenses, and the electrostatic lens is disposed between the objective lens and the shield plate.

According to another aspect of the present invention, an electron beam writing apparatus comprising a control unit and a writing unit having an electron optical column and a writing chamber, comprising; a stage on which a sample is placed in the writing unit, an electron gun unit, which is disposed in the electron optical column, configured to emit an electron beam, a shield plate, which is disposed between the stage and the electron optical column, configured to block reflected electrons or secondary electrons generated by irradiation to the sample with the electron beam from entering the writing chamber, an electrostatic lens aligned in an axial direction of the electron beam in the electron optical column, wherein the electrostatic lens is disposed immediately above the shield plate; and a retarding electrode disposed immediately above the electrostatic lens and supplied with negative voltage constantly, from a voltage supply device, during writing patterns on the sample.

According to another aspect of the present invention, an electron beam writing apparatus wherein the voltage supply device continues to apply a constant negative voltage to the retarding electrode.

According to another aspect of the present invention, an electron beam writing apparatus further comprising, a first aperture for shaping the electron beam that has been emitted from the electron gun, a second aperture further shaping the electron beam that has passed through the first aperture, an illumination lens illuminating the first aperture with the electron beam, a projection lens projecting to the second aperture the electron beam that has passed through the first aperture, and an objective lens focusing the electron beam that has passed through the second aperture, wherein the illumination lens, the projection lens, and the objective lens are all electromagnetic type lenses, and the electrostatic lens is disposed between the objective lens and the shield plate.

According to another aspect of the present invention, an electron beam writing apparatus further comprising, a deflector disposed in the electron optical column for deflecting the electron beam to a predetermined position, and an insulating plate disposed between the deflector and the retarding electrode.

According to another aspect of the present invention, an electron beam writing method in which a predetermined pattern is written on a sample placed on a stage by emitting an electron beam from an electron gun disposed in an electron optical column, wherein a negative voltage is constantly applied to the electrostatic lens for changing a focal position of the electron beam or a retarding electrode disposed immediately above the electrostatic lens.

According to another aspect of the present invention, an electron beam writing method, wherein a shield plate is disposed between the stage and the electron optical column to block reflected electrons or secondary electrons generated by irradiation to the sample with the electron beam.

According to another aspect of the present invention, an electron beam writing method, wherein the electron beam that has been emitted from the electron gun to a first aperture is illuminated by a illumination lens, projecting the electron beam that has passed through the first aperture to a second aperture by a projection lens, focusing the electron beam that has passed through the second aperture by an objective lens, and irradiating the electron beam that has passed through the objective lens on the sample through the electrostatic lens.

According to another aspect of the present invention, an electron beam writing method, wherein a negative voltage in a range between 0 V and −250 V is applied to the electrostatic lens.

According to another aspect of the present invention, an electron beam writing method wherein a negative voltage between −100 V and −200 V on average is applied to the electrostatic lens.

DETAILED DESCRIPTION OF THE EMBODIMENTS

Embodiment 1

Figure 1:
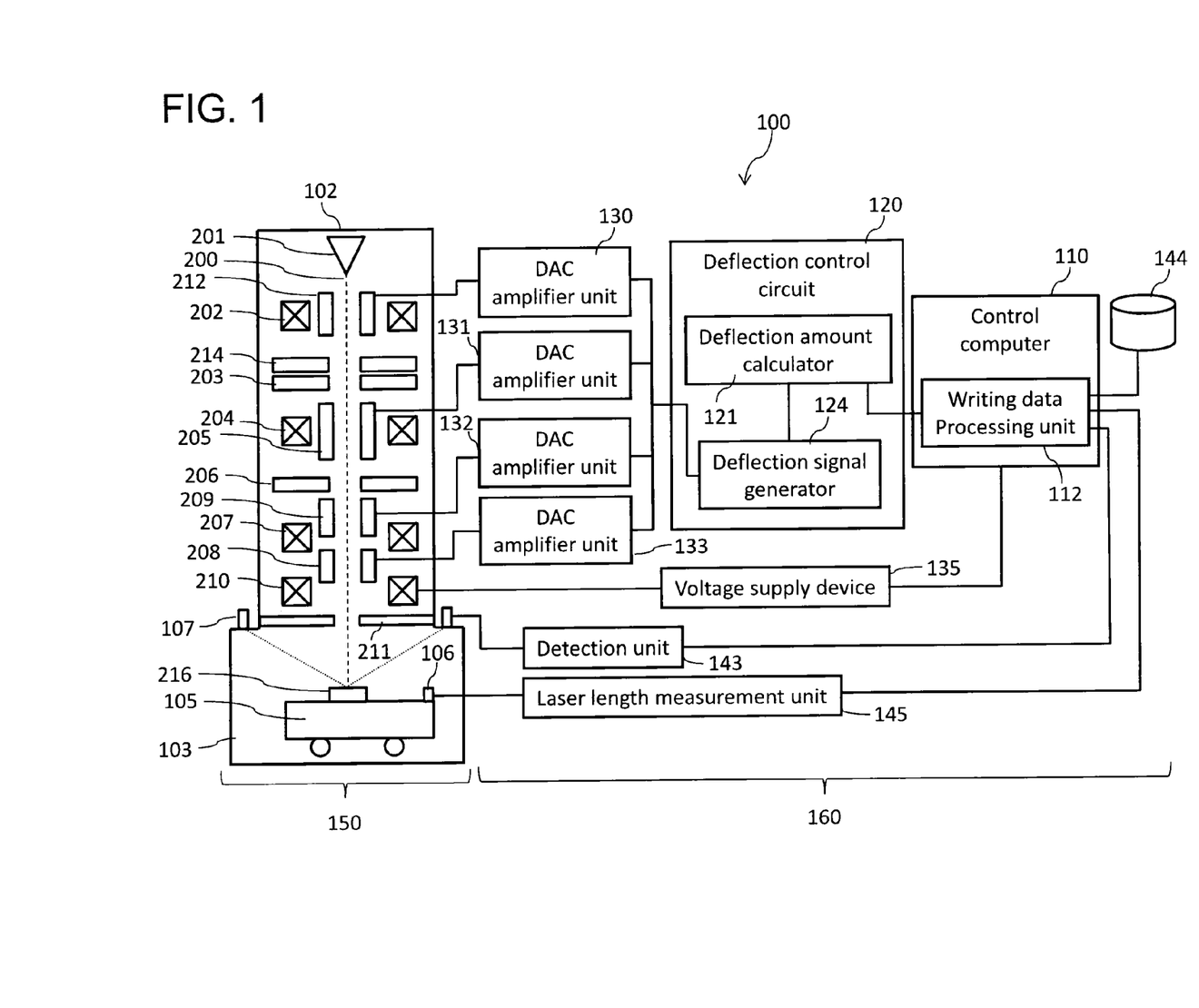
FIG. 1 is a block diagram of an electron beam writing apparatus according to embodiment 1 of the present invention.

FIG. 1 is a schematic diagram of an electron beam writing apparatus according to the first embodiment of the present invention.

The electron beam writing apparatus 100 consisting of a writing unit 150 and a control unit 160, is an example of a variable shape electron beam writing apparatus.

The writing unit 150 includes an electron optical column 102 and a writing chamber 103.

The electron optical column 102 includes an electron gun 201, an illumination lens 202, a blanking deflector 212, a blanking aperture 214, a first shaping aperture 203, a projection lens 204, a shaping deflector 205, a second shaping aperture 206, an objective lens 207, a main deflector 208, a sub-deflector 209 and an electrostatic lens 210.

The illumination lens 202, the projection lens 204, the objective lens 207, and the electrostatic lens 210 are all electromagnetic lenses for adjusting an imaging position of an electron beam 200 by changing excitation. These lenses are aligned in an axial direction of the electron beam 200, as shown in FIG. 1. Specifically, these electromagnetic lenses have electrodes (not shown) aligned in the axial direction of the electron beam 200.

The electron beam 200 emitted from the electron gun 201 is illuminated by the first shaping aperture 203, and shapes the electron beam 200 into, for example, a rectangular form. The electron beam 200 is then projected on the second shaping aperture 206 by the projection lens 204. The shaping deflector 205 controls the position of the image of the first shaping aperture on the second shaping aperture 206, thereby changing the shape and size of the electron beam 200.

The electron beam 200 passing through the second shaping aperture 206 is focused by the objective lens 207, and then deflected by the main deflector 208 and the sub-deflector 209. Thereafter, the electrostatic lens 210 corrects the focal position, and then a sample 216 placed on the writing chamber 103 is irradiated with the electron beam.

In the present embodiment, as shown in FIG. 1, it is preferred that a shield plate 211 be disposed below the electron optical column 102, specifically, below the electrostatic lens 210. By providing the shield plate 211, reflected electrons or secondary electrons, which are generated according to the irradiation to the sample 216 by the electron beam 200, and then enter the electron optical column 102, can be reduced.

As described with reference to FIGS. 5 and 6, however, the reflected electrons or secondary electrons perform a helical motion, coiling around an optical axis of the electron beam 200. Therefore, some of the reflected electrons or the secondary electrons pass through an opening of the shield plate 211, and enter the electron optical column 102, as a result the deflectors provided in the electron optical column 102, are charged, and a path of the electron beam 200 is changed. Therefore the target position on the sample 216 is not irradiated with the electron beam 200.

Therefore, the present invention prevents the formation of the electron cloud by constantly applying positive voltage to the electrodes constituting the electrostatic lens aligned in the axial direction of the electron beam.

In the present embodiment, a negative voltage is constantly applied to the electrodes composing the electromagnetic lens that are aligned in the axial direction of the electron beam. This forms a negative electric field within the electron lens barrel 102, and thus the reflected electrons or the secondary electrons are subjected to repulsion and blocked from entering the electron lens barrel 102. In other words, by applying a negative voltage to the electromagnetic lens, a potential difference between energies of the reflected electrons or the secondary electrons a potential barrier is generated. The energies that the reflected electrons or the secondary electrons have are low, as compared with electric potential of the electromagnetic lens, so that the reflected electrons or the secondary electrons cannot break through this potential barrier. Accordingly, it is possible to prevent the reflected electrons or the secondary electrons from entering the electron lens barrel 102.

For example, in a case where the electrostatic lens 210 is composed of a first electrode disposed on the side of the electron gun 201 and a second electrode disposed on the side of the sample 216, a positive voltage is applied to these electrodes. The applied voltage can be set within a range of 0 V to 250 V, for example, a voltage of 100 V to 200 V can be applied on average. By adjusting the voltage value within such a range, as one example, the focal position of the electron beam 200 can be changed by up to about 10 μm.

In FIG. 1, a XY stage 105 is positioned in the writing chamber 103.

The sample 216 to be written is mounted on the XY stage 105. When a mask is used as the sample 216, the mask has, for example, a mask substrate consisting of quartz or a similar material, a chromium (Cr) film or a molybdenum silicon (MoSi) film as a light shielding film on the mask substrate, and a resist film on the light shielding film. Next, the resist film is irradiated the electron beam 200 to write a predetermined pattern.

A reflective mirror 106 for measuring the position of the XY stage using a laser is arranged at a different position to the sample 216 positioned on the XY stage 105. The reflective mirror 106 reflects the laser emitted from a laser length measurement unit 145, then the laser length measurement unit 145 receives the laser reflected on the reflective mirror 106. Thereby the position of the XY stage 105 is found. The data of the position is outputted to a writing data processing unit 112 of the control computer 110.

A Z sensor 107 for detecting the position of the sample 216 along the height direction (Z direction) is arranged at the top of the writing chamber 199. The Z sensor 107 consists of a combination of a light emitting unit and a light receiving unit. The light emitted from the light emitting unit is reflected on the surface of the sample 216, the light reflected is then received by the light receiving unit. Thereby the height of the sample 216 is measured. The height data detected by the Z sensor 107 is sent to a detection unit 143, and is then converted to digital data, after that, it is outputted to the writing data processing unit 112 of the control computer 110.

The blanking deflector 212 may be replaced with a plurality of electrodes, for example, two or four electrodes. Each of the shaping deflector 205, the main deflector 208 and the sub-deflector 209 may be replaced with a plurality of electrodes, for example, four or eight electrodes. The electrode of each of the deflectors is individually connected to at least one DAC (Digital Analog Converter).

The control unit 160 includes the control computer 110, a deflection control circuit 120, the DAC amplifier units (130 to 133) and a storage device, such as a magnetic disk.

The control computer 110, the deflection control circuit 120 and the storage device 144 are connected to each other through buses (not shown). The deflection control circuit 120 and the DAC amplifier units (130 to 133) are also connected to each other through buses (not shown).

The DAC amplifier unit 130 is connected to the blanking deflector 212. The DAC amplifier unit 131 is connected to the shaping deflector 205. The DAC amplifier unit 132 is connected to the sub-deflector 209. The DAC amplifier unit 133 is connected to the main deflector 208.

The deflection control circuit 120 transmits the digital signals for controlling the DAC amplifier units (130 to 133), respectively. The digital signals are then converted into analog signals. The DAC amplifier units (130 to 133) amplify the converted analog signals and then transmit the amplified analog signals as deflection voltage to the corresponding deflectors, respectively. The electron beam 200 is then deflected to the desired position.

Figure 2:
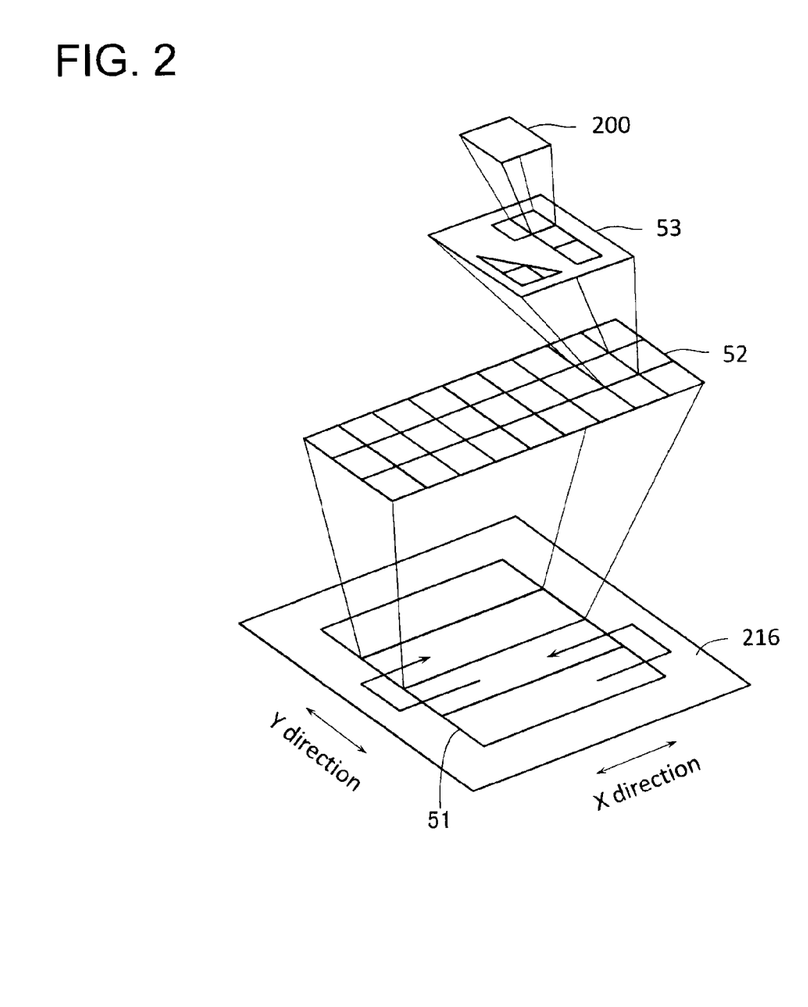
FIG. 2 is an illustrative diagram of writing with an electron beam.

FIG. 2 is an illustrative diagram of writing with an electron beam 200.

As shown in FIG. 1 and FIG. 2, patterns 51 that will be written on the sample 216 are each divided into rectangular frame regions 52. Writing with an electron beam 200 is repeated for each frame region 52 while the XY stage 105 continuously moves in one direction, for example in the plus or minus X-direction. The frame region 52 is further divided into sub-deflection regions 53, and the electron beam 200 writes only necessary internal portions of each sub-deflection region 53. The frame region 52 is a rectangular writing region determined by deflection width of the main deflector 208, and the sub-deflection region 53 is a writing region determined by deflection width of the sub-deflector 209.

The determination of the standard position of the sub-deflection regions 53 is done with the main deflector 208, writing inside the sub-deflection regions 53 is controlled by sub-deflector 209. That is, the electron beam 200 is positioned in the specified sub-deflection regions 53 by the main deflector 208, determining the writing position inside sub-deflection regions 53 by the sub-deflector 209. Furthermore, the shaping deflector 205, and the aperture 203 and 206 for shaping the electron beam determine the shape and size of the electron beam 200. While the XY stage 105 is continuously moved in one direction a pattern is written in the inside of the sub-deflection region 53, and upon completion of the writing, the next sub-deflection region 53 is written. After all internal sub-deflection regions 53 of the frame region 52 have been written, the XY stage 105 is moved in steps in a direction (e.g., the plus or minus Y-direction) that is orthogonal to the continuous moving direction. Similar processing is then repeated for sequential writing of the frame region 52.

The sub-deflection regions 53 are regions that are scanned and written by the electron beam 200, faster than scanning and writing of main deflection regions by sub-deflector 209, sub-deflection regions 53 are usually the smallest writing regions. When writing is performed inside the sub-deflection regions 53, the size and shape of shot are prepared according to the pattern shape, the shaping deflector 205 then forms the desired shot. Specifically, the electron beam 200 is irradiated from the electron gun 201, the first aperture 203 forms the beam into a square shape, the electron beam is then projected to the second shaping aperture 206 by the shaping deflector 205, the 2nd aperture 18 changes the beam shape and size. After that, the electron beam 200 deflected by sub-deflector 209 and main deflector 208, is irradiated to the sample 216 which is mounted on XY stage 105.

When the sample 216 is irradiated with an electron beam 200, electrons reflected on the sample 216 (reflected electrons) or electrons generated after entering the sample 216 (secondary electrons) are generated. The reflected electrons or the secondary electrons perform a helical motion, coiling around the axis of the electron beam 200, and proceed upward within an electron optical column 102. In the present embodiment, since positive electric potential is constantly given to the electrodes that the electrostatic lens 210 is composed of, the reflected electrons or the secondary electrons entering the electron optical column 102 are attracted and moved to the magnetic field formed by the electrostatic lens 210. This prevents the formation of the electron cloud within the electron optical column 102, and thus the electron beam 200 is prevented from drifting, so that a desired position on the sample 216 can be irradiated with the electron beam 200.

Next, a method for writing desired patterns on the sample 216 using the electron beam writing apparatus shown in FIG. 1, is will be described.

In FIG. 1, the control computer 110 is connected to the storage device 144. The control computer 110 includes the writing data processing unit 112.

CAD data prepared by the designer (or user) is converted to design intermediate data in a hierarchical format such as OASIS. The design intermediate data includes data of the pattern formed on the sample 216 created for each layer. It should be noted that, generally, the electron beam writing apparatuses are not adapted to be able to directly read OASIS data. That is, each manufacturer of the electron beam writing apparatus uses different format data. Therefore, OASIS data is converted, for each layer, to format data in a format specific to the electron beam writing apparatus used, and this format data is input to the electron beam writing apparatus.

In FIG. 1, format data is entered into the electron beam writing apparatus 100 via the storage device 144.

The designed pattern includes pattern features each consisting of basic features such as rectangles and triangles. The storage device 144 stores feature data indicating the shape, size, and position of each pattern feature, specifically, information such as the coordinates (x, y) of the reference position of each feature, the length of its sides, and a shape code (or identifier) identifying the type of shape such as a rectangle or triangle.

Further, a group of pattern features, defined in an area of approximately a few tens of micrometers Square, is referred to as a "cluster" or "cell". It is common practice that the design pattern data is defined in a hierarchical structure using clusters or cells. A cluster (or cell), which contains a pattern feature or features, may be used alone or repeated at certain intervals. In the former case the coordinate positions of the cluster (or cell) on the sample 216 are specified, whereas in the latter case the coordinate positions of each copy of the cluster (or cell) are indicated together with a repetition instruction. Each cluster (or cell) is disposed in a strip-shaped region, referred to as a "frame" or "stripe", having a width of a few hundreds of micrometers and a length of approximately 100 mm that corresponds to the length of the sample 216 in the X or Y direction.

The division of the pattern into pattern elements is performed based on the maximum shot size determined by the size of the electron beam 200, and the coordinate positions, size, and exposure time of each divided shot are also set. Then, writing data is generated so that each shot is shaped in accordance with the shape or size of a pattern element to be written. The writing data is divided into strip-like frame regions (main deflection regions), and each of the frame regions is further divided into sub-deflection regions. That is, the writing data of the entire wafer has a hierarchical data structure including the data of a plurality of strip-like frames whose size corresponds to the size of the main deflection region and the data of a plurality of sub-deflection region units, smaller in size than the main deflection region, in the frame.

In FIG. 1, write data which is read from the storage device 144 by the control computer 110, is processed through a plurality of steps in the writing data processing unit 112, thereby generating shot data. The shot data is transmitted to a deflection amount calculator 121 of the deflection control circuit 120.

The deflection amount calculator 121 receives the shot data, the positional information on an XY stage 105, and the height information on the sample 216 sent from the writing data processor 112. Then, the deflection amount calculator 121 calculates respective deflection amounts in the blanking deflector 212, the shaping deflector 205, the sub-deflector 209, and the main deflector 208. The respective deflection amounts thus obtained are sent to a deflection signal generator 124.

The deflection signal generator 124 generates a deflection signal to be applied to each electrode of the blanking deflector 212, the shaping deflector 205, the sub-deflector 209, and the main deflector 208. Each deflection signal is outputted to each of the corresponding DAC amplifier units 130 to 133.

After the DAC amplifier units 130 to 133 convert deflection signals that are digital signals outputted from the deflection signal generator 124 into analog signals, respectively, they amplify the analog signals to produce deflection voltages. The deflection voltages produced are applied to the corresponding deflectors 212, 205, 209, 208.

The electron beam 200 emitted from the electron gun 201 illuminates the first shaping aperture 203 through the illumination lens 202. This shapes the electron beam 200 into a rectangle, for example. Subsequently, the electron beam 200 is projected to the second shaping aperture 206 by the projection lens 204. The deflection voltage applied to the shaping deflector 205 determines the projection position in the second shaping aperture 206.

It should be noted that the blanking aperture 214 and the blanking deflector 212 serve to control irradiation to the sample 216 with the electron beam 200.

The electron beam 200 passing through the second shaping aperture 206 is shaped into the desired shape and size. Next, electron beam 200 passing through the second shaping aperture 206 is focused by the objective lens 207, and then deflected by the main deflector 208 and the sub-deflector 209. That is, the electron beam 200 is deflected to the position corresponding to deflection voltage applied to the main deflector 208 and the sub-deflector 209, respectively. The main deflector 208 positions the electron beam 200 in the sub-deflection region on the sample 216. The sub-deflector 209 positions the electron beam 54 at a writing position in the sub-deflection region.

The electron beam 200, which is deflected by the main deflector 208 and the sub-deflector 209, is focused on the sample 216. In the present embodiment, electric potential of the electrodes that the electrostatic lens 210 is composed of, is constantly positive. That is, positive electric potential is constantly given to the electrostatic lens 210 by the voltage supply device 135 during writing. The control computer 110 controls the voltage supply device 135. For example, a voltage in a range between 0 V between 250 V can be applied from the voltage supply device 135 to the electrostatic lens 210. When the applied voltage is changed, thereby the focal position of the electron beam 200 is changed. In this case, it is preferable that a voltage in a range between 100 V and 200 V on average, for example, is applied to the electrostatic lens 210 considering offset.

As mentioned above, the sample 216 is mounted on the XY stage 105. The shield plate 211 is arranged between the XY stage 105 and the electron optical column 102. The electric potential of the sample 216, the XY stage 105 and the shield plate 211 is 0V, respectively. Therefore if the electric potential of the electrostatic lens 210 is constantly positive, the reflected electrons or the secondary electron generated when the sample 216 is irradiated with the electron beam 200, are attracted and moved to the magnetic field formed by the electrostatic lens 210 to proceed upward within an electron optical column 102. That is, the electrostatic lens 210 forms a positive electric field, thereby the reflected electrons or the secondary electron is accelerated, then it can be prevented that the reflected electrons or the secondary electrons remains within the electron optical column 102. Accordingly, the present invention is capable of reducing drift of the electron beam 200 and irradiating the electron beam 200 to the desired position.

Embodiment 2

Figure 3:
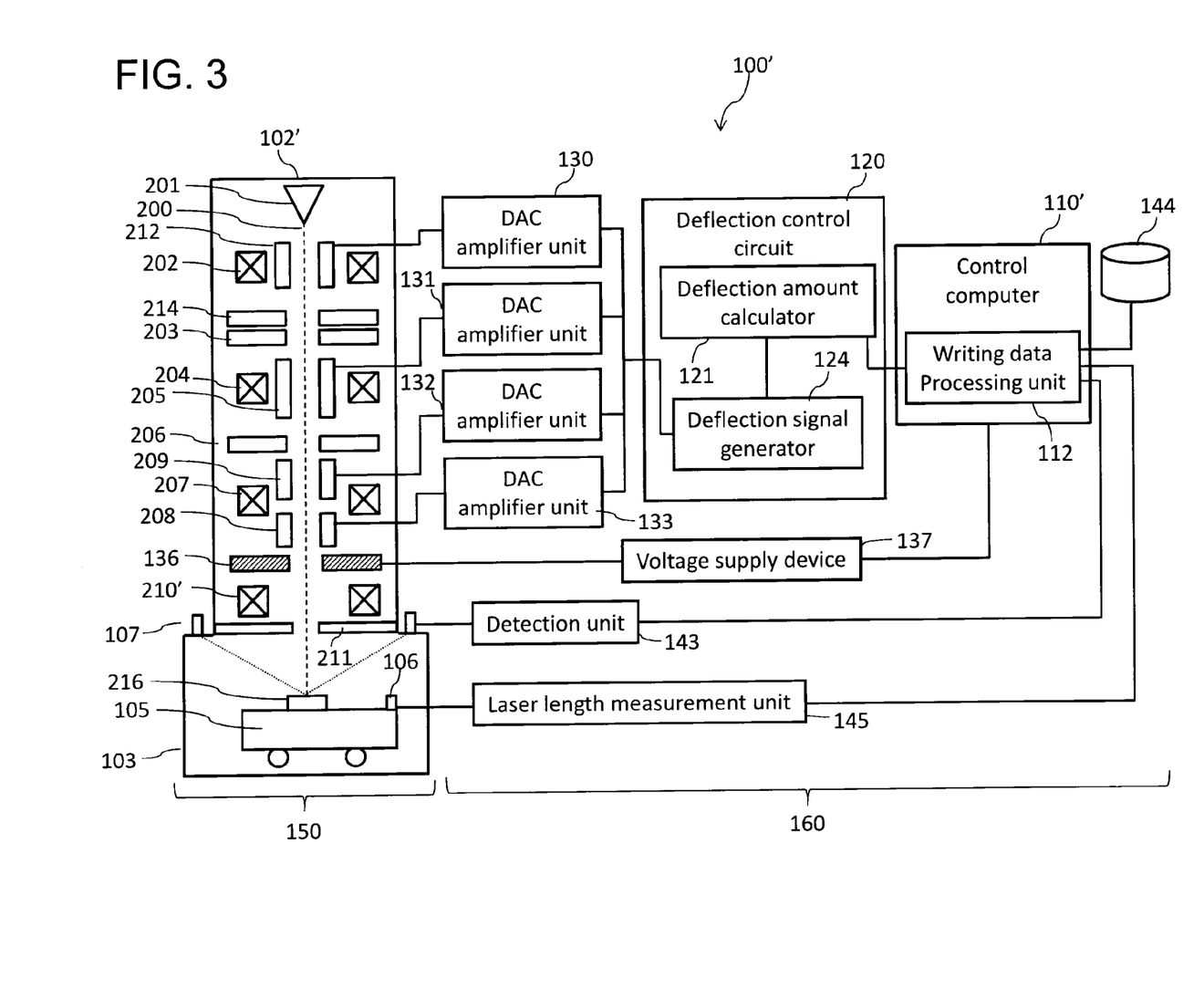
FIG. 3 is a block diagram of an electron beam writing apparatus according to embodiment 2 of the present invention.

FIG. 3 is a schematic diagram of an electron beam writing apparatus according to an embodiment of the present invention. In FIG. 3, the same components as those in FIG. 1 are denoted by the same reference numerals, and therefore, the detailed description will not be repeated here.

In an electron beam writing apparatus 100' shown in FIG. 3, the electron optical column 102' includes an electron gun 201, an illumination lens 202, a blanking deflector 212, a blanking aperture 214, a first shaping aperture 203, a projection lens 204, a shaping deflector 205, a second shaping aperture 206, an objective lens 207, a main deflector 208, a sub-deflector 209, a retarding electrode 136 and an electrostatic lens 210.

The illumination lens 202, the projection lens 204, the objective lens 207, and the electrostatic lens 210' are all electromagnetic lenses to adjust an imaging position of an electron beam 200 by changing excitation. These lenses are aligned in an axial direction of the electron beam 200, as shown in FIG. 1. Specifically, these electromagnetic lenses have electrodes (not shown) aligned in the axial direction of the electron beam 200.

The electron beam 200 emitted from the electron gun 201 illuminates the first shaping aperture 203 through the illumination lens 202, whereby the electron beam 200 is shaped into, for example, a rectangular form. The electron beam 200 is then projected on the second shaping aperture 206 by the projection lens 204. The shaping deflector 205 controls the position of the image of the first shaping aperture on the second shaping aperture 206, thereby changing the shape and size of the electron beam 200. The electron beam 200 passing through the second shaping aperture 206 is focused by the objective lens 207, and then deflected by the main deflector 208 and the sub-deflector 209. Thereafter, the focal position is corrected by the electrostatic lens 210', and then a sample 216 placed on the writing chamber 103 is irradiated with the electron beam.

In the present embodiment, as shown in FIG. 3, it is preferable that a shield plate 211 be disposed below the electron optical column 102', specifically, below the electrostatic lens 210'. By providing the shield plate 211, reflected electrons or secondary electrons that are generated according to the irradiation to the sample 216 with the electron beam 200, and then enter the electron optical column 102', can be reduced.

As described with reference to FIGS. 5 and 6, however, the reflected electrons or secondary electrons perform a helical motion, coiling around an optical axis of the electron beam 200. Therefore, some of the reflected electrons or the secondary electrons pass through an opening of the shield plate 211, and enter the electron optical column 102'. As a result, the deflectors provided in the electron optical column 102' are charged, and a path of the electron beam 200 is changed. Therefore the target position on the sample 216 is not irradiated with the electron beam 200.

Therefore, in the present embodiment, the retarding electrode 136 is disposed within the electron lens barrel 102' and a negative voltage is applied to the retarding electrode 136 by a voltage supply device 137. This forms a negative electric field within the electron lens barrel 102', so that the reflected electrons or the secondary electrons are subjected to the repulsion and blocked from advancing upward within the electron lens barrel 102'. That is, by providing the retarding electrode 136, the reflected electrons or the secondary electrons are retarded and prevented from entering upward beyond the retarding electrode 136.

As shown in FIG. 3, it is preferable that the retarding electrode 136 be disposed immediately above the electrostatic lens 210'. Alternatively, such a configuration can be adopted in that the electrostatic lens 210' is composed of a plurality of electrodes, any of which is the retarding electrode 136. In either case, the voltage applied to the retarding electrode 136 is set at a value that does not interfere with the focal-position correcting function of the electrostatic lens 210'.

A negative voltage continues to be applied to the retarding electrode 136 while writing with the electron beam 200 is performed. It is preferred that this applied voltage be constant. This is to avoid the effect of a change in the applied voltage on the electron beam 200.

In the present embodiment, the voltage applied to the electrostatic lens 210' can be set within a range of 0 V to 250 V, as one example, and a voltage of 100 V to 200 V can be applied on average. By adjusting the voltage value within such a range, the focal position of the electron beam 200 can be changed by up to about 10 μm, for example.

Next, a method for writing desired patterns on the sample 216 using the electron beam writing apparatus 100' shown in FIG. 3, will be described.

When a mask is used as the sample 216, the mask has, for example, a mask substrate consisting of quartz or a similar material, a chromium (Cr) film or a molybdenum silicon (MoSi) film as a light shielding film on the mask substrate, and a resist film on the light shielding film. Next, the resist film is irradiated the electron beam 200 to write a predetermined pattern.

In FIG. 3, the control computer 110' is connected to the storage device 144. The control computer 110' includes the writing data processing unit 112. Write data which is read from the storage device 144 by the control computer 110', is processed through a plurality of steps in the writing data processing unit 112. Shot data is generated, the shot data is then transmitted to a deflection amount calculator 121 of the deflection control circuit 120.

The deflection amount calculator 121 receives the shot data, the positional information on an XY stage 105, and the height information on the sample 216 sent from the writing data processor 112. Then, the deflection amount calculator 121 calculates respective deflection amounts in the blanking deflector 212, the shaping deflector 205, the sub-deflector 209, and the main deflector 208. The respective deflection amounts thus obtained are sent to a deflection signal generator 124.

The deflection signal generator 124 generates a deflection signal to be applied to each electrode of the blanking deflector 212, the shaping deflector 205, the sub-deflector 209, and the main deflector 208. Each deflection signal is outputted to each of the corresponding DAC amplifier units 130 to 133.

After the DAC amplifier units 130 to 133 convert deflection signals that are digital signals outputted from the deflection signal generator 124 into analog signals, respectively, they amplify the analog signals to produce deflection voltages. The deflection voltages produced are applied to the corresponding deflectors 212, 205, 209, 208.

The electron beam 200 emitted from the electron gun 201 illuminates the first shaping aperture 203 through the illumination lens 202. This shapes the electron beam 200 into a rectangle, for example. Subsequently, the electron beam 200 is projected to the second shaping aperture 206 by the projection lens 204. The deflection voltage applied to the shaping deflector 205 determines the projection position in the second shaping aperture 206.

It should be noted that the blanking aperture 214 and the blanking deflector 212 serve to control irradiation to the sample 216 with the electron beam 200.

The electron beam 200 passing through the second shaping aperture 206 is shaped into the desired shape and size. Next, the electron beam 200 passing through the second shaping aperture 206 is focused by the objective lens 207, and then deflected by the main deflector 208 and the sub-deflector 209. That is, the electron beam 200 is deflected to the position corresponding to the deflection voltage applied to the main deflector 208 and the sub-deflector 209, respectively. The main deflector 208 positions the electron beam 200 in the sub-deflection region on the sample 216, the sub-deflector 209 positions the electron beam 54 at a writing position in the sub-deflection region.

The electron beam 200 which is deflected by the main deflector 208 and the sub-deflector 209, is focused on the sample 216 by the electrostatic lens 210'. Specifically, an applied voltage to the electrodes composing the electrostatic lens 210' is changed; thereby a focal position of the electron beam 200 can be changed. In the present embodiment, as one example, a voltage in a range between 0 V between 250 V can be supplied to the electrostatic lens 210'. Moreover it is preferable that a voltage in a range of between 100 V and 200 V on average, is applied to the electrostatic lens 210 considering offset.

The retarding electrode 136 is disposed immediately above the electrostatic lens 210'. A negative voltage is applied to the retarding electrode 136 by a voltage supply device 137. The control computer 110' controls the operation of the voltage supply device 137. For example, in a case where a voltage of 100 V to 200 V on average within a range of 0 V to −250 V is applied to the electrostatic lens 210', the voltage applied to the retarding electrode 136 can be set at −30 V.

As shown in FIG. 3, the sample 216 is placed on the XY stage 105. In addition, the shield plate 211 is disposed between the XY stage 105 and the electron lens barrel 102'. Here, the potentials of the sample 216, the XY stage 105, and the shield plate 211 are all 0 V. In addition, an insulating plate (not shown in FIG. 3) is disposed between the retarding electrode 136 and the main deflector 208. In this embodiment, the insulating plate consists of a single metal plate, however the invention is not limited to this. The potential of the insulating plate is also 0 (zero) V.

Figure 4:
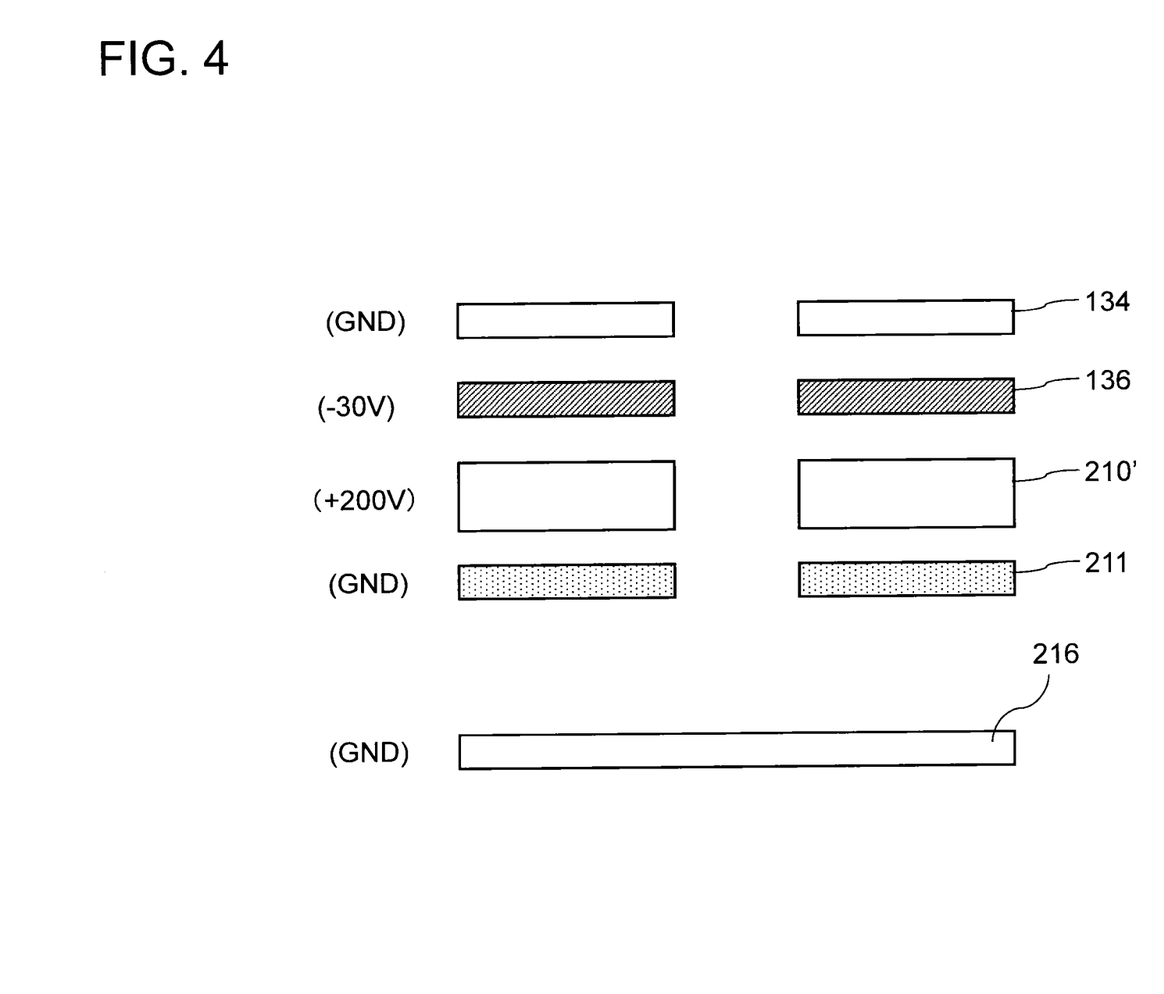
FIG. 4 is an example of the relationship between electric potentials around an electrostatic lens in embodiment 2.

FIG. 4 is an example of a relationship between the above electric potentials. In FIG. 4, the electric potentials of the sample 216, the shield plate 211, and the insulating plate 134 are all 0 (zero) V. On the other hand, a voltage of 200 V and a voltage of −30 V are applied to the electrostatic lens 210' and the retarding electrode 136, respectively. This causes the reflected electrons or the secondary electrons entering the electron lens barrel 102' to be attracted to the positive electric field formed by the electrostatic lens 210', however, since the negative voltage is applied to the retarding electrode 136, the reflected electrons or the secondary electrons are retarded. A potential difference between the retarding electrode 136 and the insulating plate 134, namely, an energy barrier, blocks the reflected electrons or the secondary electrons from moving upward beyond the retarding electrode 136. As well as blocking reflected or secondary electrons with the retarding electrode 136, the insulating plate 134 also functions to stop the spread of an electric field generated as a result of negative voltage from the retarding electrode 136 into an area above the insulating plate 134. Furthermore, the shield plate 211 also functions to block positive voltage from spreading lower than the electrostatic lens 210'.

According to the present embodiment, it is possible to prevent the reflected electrons or the secondary electrons from moving upward in the electron optical column 102, and charging the deflectors. Therefore the drift of the electron beam 200 can be reduced, and it becomes possible to irradiate a desired position on the sample 216 with the electron beam 200.

The features and advantages of the present invention may be summarized as follows.

According to the present embodiment, an electron beam writing apparatus is described capable of reducing drift of the electron beam due to the reflected electrons or the secondary electrons via a voltage supply device constantly applying negative voltage to the electrostatic lens.

Further, according to the present embodiment, an electron beam writing apparatus is described capable of reducing drift of the electron beam due to the reflected electrons or the secondary electrons by the retarding electrode disposed immediately above the electrostatic lens, and the voltage supply device, which applies the negative voltage to the retarding electrode.

Further, according to the present embodiment, since a negative voltage is applied to the electrostatic lens provided with electrodes aligned in an axial direction of the electron beam, for changing the focal position of the electron beam, or the retarding electrode disposed immediately above the electrostatic lens, there is provided an electron beam writing apparatus capable of reducing drift of the electron beam due to the reflected electrons or the secondary electrons.

The present invention is not limited to the above embodiments and may be modified in various forms without departing from the scope of the invention.

For example, with form of the above-mentioned execution an electron beam was used, however, the present invention is not limited thereto and may utilize a different charged particle beam, for example an ion beam.

What is claimed is:

1. An electron beam writing apparatus comprising a control unit and a writing unit having an electron optical column and a writing chamber, comprising;
    a stage on which a sample is placed in the writing unit;
    an electron gun unit, which is disposed in the electron optical column, configured to emit an electron beam;
    a shield plate, which is disposed between the stage and the electron optical column, configured to reduce reflected electrons or secondary electrons generated by irradiation to the sample with the electron beam from entering the electron optical column; and
    an electrostatic lens positioned in an axial direction of the electron beam in the electron optical column,
    wherein the electrostatic lens is disposed immediately above the shield plate and is supplied with negative voltage, from a voltage supply device, constantly during writing patterns on the sample, and is configured to block the reflected electrons or the secondary electrons from entering the electron optical column.

2. The electron beam writing apparatus according to claim 1, wherein a negative voltage in a range between 0 V and −250 V is applied from the voltage supply device to the electrostatic lens.

3. The electron beam writing apparatus according to claim 2, wherein a negative voltage between −100 V and −200 V on average is applied from the voltage supply device to the electrostatic lens.

4. The electron beam writing apparatus according to claim 1, further comprising:
    a first aperture for shaping the electron beam that has been emitted from the electron gun;
    a second aperture further shaping the electron beam that has passed through the first aperture;
    an illumination lens illuminating the first aperture with the electron beam;
    a projection lens projecting to the second aperture the electron beam that has passed through the first aperture; and
    an objective lens focusing the electron beam that has passed through the second aperture, wherein
    the illumination lens, the projection lens, and the objective lens are all electromagnetic type lenses, and
    the electrostatic lens is disposed between the objective lens and the shield plate.

5. An electron beam writing apparatus comprising a control unit and a writing unit having an electron optical column and a writing chamber, comprising;
    a stage on which a sample is placed in the writing unit;
    an electron gun unit, which is disposed in the electron optical column, configured to emit an electron beam;
    a shield plate, which is disposed between the stage and the electron optical column, configured to reduce reflected electrons or secondary electrons generated by irradiation to the sample with the electron beam from entering the electron optical column;
    an electrostatic lens aligned in an axial direction of the electron beam in the electron optical column, wherein the electrostatic lens is disposed immediately above the shield plate; and
    a retarding electrode disposed immediately above the electrostatic lens and supplied with negative voltage constantly, from a voltage supply device, during writing patterns on the sample, and is configured to block the reflected electrons or the secondary electrons from entering the electron optical column.

6. The electron beam writing apparatus according to claim 5, wherein the voltage supply device continues to apply a constant negative voltage to the retarding electrode.

7. The electron beam writing apparatus according to claim 5, further comprising:
    a first aperture for shaping the electron beam that has been emitted from the electron gun;
    a second aperture further shaping the electron beam that has passed through the first aperture;
    an illumination lens illuminating the first aperture with the electron beam;
    a projection lens projecting to the second aperture the electron beam that has passed through the first aperture; and
    an objective lens focusing the electron beam that has passed through the second aperture, wherein
    the illumination lens, the projection lens, and the objective lens are all electromagnetic type lenses, and
    the electrostatic lens is disposed between the objective lens and the shield plate.

8. The electron beam writing apparatus according to claim 5, further comprising:
    a deflector disposed in the electron optical column for deflecting the electron beam to a predetermined position; and
    an insulating plate disposed between the deflector and the retarding electrode.

9. An electron beam writing method comprising:
    writing a predetermined pattern on a sample placed on a stage by emitting an electron beam from an electron gun disposed in an electron optical column, wherein
    a negative voltage is constantly applied to an electrostatic lens for changing a focal position of the electron beam or a retarding electrode disposed immediately above the electrostatic lens, during the writing of the predetermined pattern on the sample to block reflected electrons or secondary electrons generated by irradiation to the sample with the electron beam from entering the electron optical column.

10. The electron beam writing method according to claim 9, wherein a shield plate is disposed between the stage and the electron optical column to reduce the reflected electrons or the secondary electrons from entering the electron optical column.

11. The electron beam writing method according to claim 9,
    wherein the electron beam that has been emitted from the electron gun to a first aperture is illuminated by a illumination lens, and the method further comprises
    projecting the electron beam that has passed through the first aperture to a second aperture by a projection lens;
    focusing the electron beam that has passed through the second aperture by an objective lens; and irradiating the electron beam that has passed through the objective lens on the sample through the electrostatic lens.

12. The electron beam writing method according to claim 9, wherein a negative voltage in a range between 0 V and −250 V is applied to the electrostatic lens.

13. The electron beam writing method according to claim 12, wherein a negative voltage between −100 V and −200 V on average is applied to the electrostatic lens.

* * * * *